United States Patent
Becht et al.

(10) Patent No.: US 12,320,843 B2
(45) Date of Patent: Jun. 3, 2025

(54) PROCESSOR DEBUGGING OVER AN INTERCONNECT FABRIC

(71) Applicant: International Business Machines Corporation, Armonk, NY (US)

(72) Inventors: Michael James Becht, Poughkeepsie, NY (US); Clinton E. Bubb, Milton, NY (US)

(73) Assignee: International Business Machines Corporation, Armonk, NY (US)

( * ) Notice: Subject to any disclaimer, the term of this patent is extended or adjusted under 35 U.S.C. 154(b) by 6 days.

(21) Appl. No.: 18/459,149

(22) Filed: Aug. 31, 2023

(65) Prior Publication Data

US 2025/0076375 A1 Mar. 6, 2025

(51) Int. Cl.
*G01R 31/317* (2006.01)
*G01R 31/319* (2006.01)

(52) U.S. Cl.
CPC . *G01R 31/31705* (2013.01); *G01R 31/31926* (2013.01)

(58) Field of Classification Search
None
See application file for complete search history.

(56) References Cited

U.S. PATENT DOCUMENTS

| | | | |
|---|---|---|---|
| 7,990,994 B1 * | 8/2011 | Yeh | H04L 12/4641 711/147 |
| 8,683,163 B2 | 3/2014 | Morfey et al. | |
| 2004/0012600 A1 * | 1/2004 | Deering | G06T 15/005 345/506 |
| 2013/0107872 A1 * | 5/2013 | Lovett | H04L 49/00 370/352 |
| 2021/0271589 A1 * | 9/2021 | Denkel | G06F 11/3664 |
| 2022/0374326 A1 * | 11/2022 | Fleckenstein | G06F 11/348 |
| 2023/0079727 A1 * | 3/2023 | Windh | G06F 11/3648 717/124 |
| 2023/0129200 A1 * | 4/2023 | Carrieri | G06F 11/362 717/124 |
| 2024/0110975 A1 * | 4/2024 | Kurts | H04L 9/0631 |
| 2024/0329130 A1 * | 10/2024 | Kandula | G01R 31/31724 |

OTHER PUBLICATIONS

E. Todorovich, M. Leonetti and R. Brinks, "An advanced NoC with debug services on FPGA," 2014 IX Southern Conference on Programmable Logic (SPL), Buenos Aires, Argentina, 2014, pp. 1-6, doi: 10.1109/SPL.2014.7002201. (Year: 2014).*

D. L. Russell and H. M. Rarig, "Intelligent interconnect-combimwd circuit and packet switch," MILCOM 1987—IEEE Military Communications Conference—Crisis Communications: The Promise and Reality, Washington, DC, USA, 1987, pp. 0788-0795, (Year: 1987).*

* cited by examiner

*Primary Examiner* — Daniel F. McMahon
(74) *Attorney, Agent, or Firm* — Patterson + Sheridan, LLP

(57) ABSTRACT

Systems and techniques for performing processor debugging over an internal interconnect fabric are described. An example techniques includes obtaining interconnect fabric traffic comprising one or more debugging commands for a first processor within a computing system. The interconnect fabric traffic with the one or more debugging commands is converted into debugging traffic with the one or more debugging commands. The debugging traffic is routed to a debug port of the first processor.

20 Claims, 4 Drawing Sheets

PROCESSOR DEBUGGING OVER AN INTERCONNECT FABRIC

BACKGROUND

The present invention relates to data processing systems, and more specifically, to systems and techniques for performing debugging of a processor over an interconnect fabric.

Data processing systems may include multiple, sometimes relatively large amount of, physical hardware (e.g., processors, memory, storage, I/O, and combinations thereof) to perform different types of workloads (e.g., batch processing, transaction processing, etc.). For example, large data processing systems, such as mainframe computers, may include multiple clusters of processors (e.g., central processing units (CPUs)), memory, and other hardware, where one or more processors in each cluster may have different access pathways to the memory.

In certain instances, a user (e.g., administrator, designer, etc.) may use an external device to access the data processing system to perform source level debugging. For example, the data processing system may include an externally accessible interface that can be accessed by the external device. A debug interface is one example of an externally accessible interface that is designed to provide a mechanism by which an external device is able to inspect and change the state of various items (e.g., registers, memory, input/output (I/O) interfaces, etc.) of the data processing system.

SUMMARY

One embodiment described herein is a computer-implemented method. The computer-implemented method includes obtaining interconnect fabric traffic comprising one or more debugging commands for a first processor within a computing system. The computer-implemented method also includes converting the interconnect fabric traffic with the one or more debugging commands into debugging traffic with the one or more debugging commands. The computer-implemented method further includes routing the debugging traffic to a debug port of the first processor.

Another embodiment described herein is a system. The system includes a first processor and a local bypass network coupled to the first processor. The local bypass network is configured to perform an operation. The operation includes obtaining interconnect fabric traffic comprising one or more debugging commands for a first processor within a computing system. The operation also includes converting the interconnect fabric traffic with the one or more debugging commands into debugging traffic with the one or more debugging commands. The operation further includes routing the debugging traffic to a debug port of the first processor.

Another embodiment described herein is a computer-readable storage medium. The computer-readable storage medium has computer-readable program code embodied therewith. The computer-readable program code is executable by one or more computer processors to perform an operation. The operation includes obtaining interconnect fabric traffic comprising one or more debugging commands for a first processor within a computing system. The operation also includes converting the interconnect fabric traffic with the one or more debugging commands into debugging traffic with the one or more debugging commands. The operation further includes routing the debugging traffic to a debug port of the first processor.

DETAILED DESCRIPTION

Figure 1:
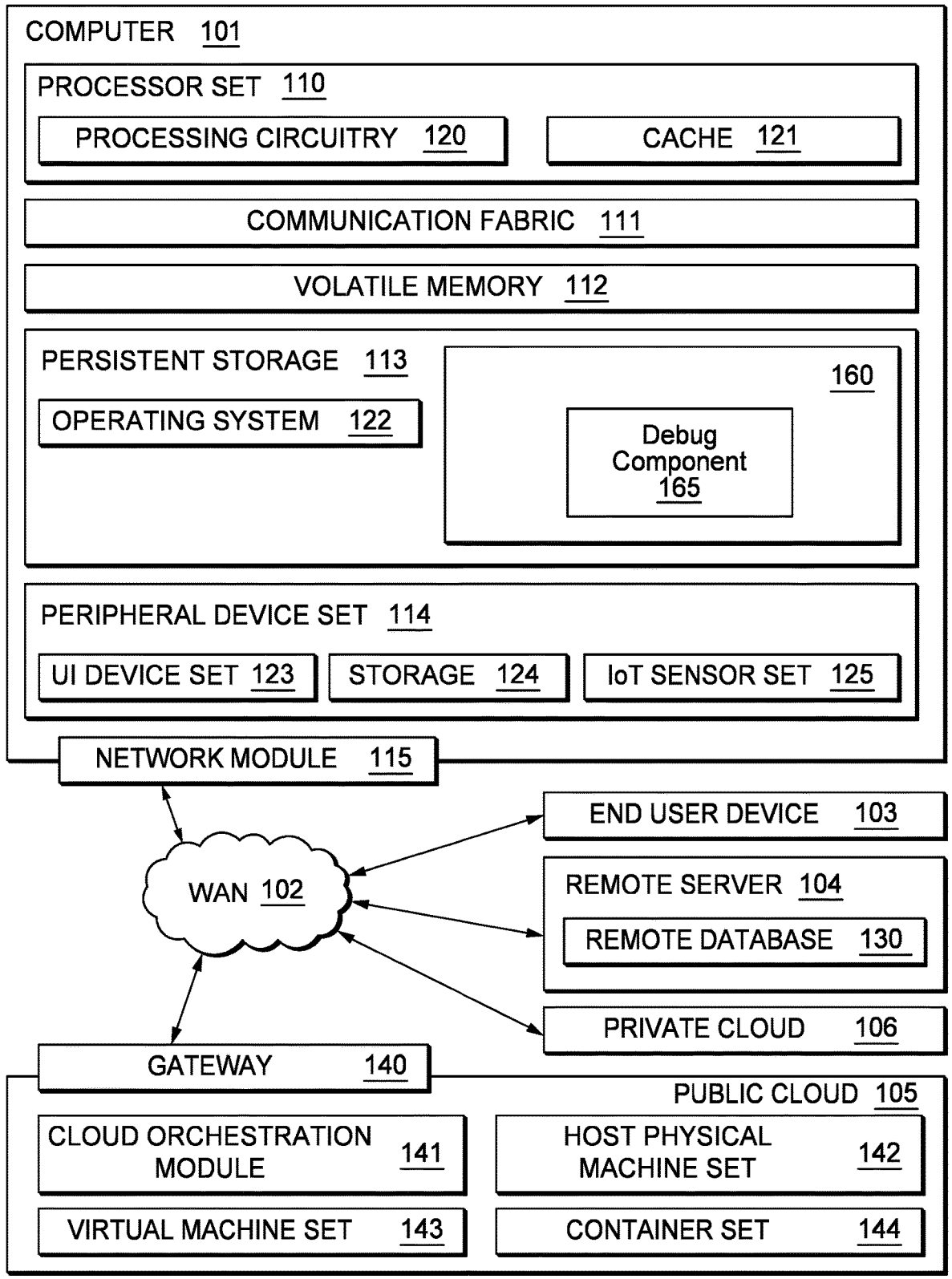
FIG. 1 is a block diagram of a computing environment, according to one embodiment.

In certain data processing systems with large numbers of processors, performing debugging using an external device can be significantly complex and time consuming. Such systems, for example, may have packaging limitations or a form factor that prevents access to one or more components (e.g., processors) using external debug connections and external debuggers (or external debug connectors). Consequently, in such systems, it may not be possible to perform debugging using conventional debugging protocols, such as JTAG-based debugging, as an illustrative, non-limiting example.

To address this, certain embodiments described herein provide systems and techniques for performing debugging of a processor within a data processing system using an interconnect within the data processing system. More specifically, embodiments may allow for performing processor debugging by tunneling debug traffic over an internal interconnect fabric within the data processing system. In certain embodiments, the debugging techniques may be implemented without using point to point serial debug connections (e.g., serial JTAG connections) and without utilizing bypass commands typically associated with serial debuggers.

Note, to clearly point out novel features of the present invention, the following discussion omits or only briefly describes conventional features of data processing systems which are apparent to those skilled in the art. It is assumed that those skilled in the art are familiar with the general architecture of processors, and in particular with processors which operate in an in-order dispatch, out-of-order execution, or in-order completion fashion. It may be noted that a numbered element is numbered according to the figure in which the element is introduced, and is referred to by that number throughout succeeding figures. Additionally, as used herein, a hyphenated form of a reference numeral refers to a specific instance of an element and the un-hyphenated form of the reference numeral refers to the collective element. Thus, for example, device "12-1" refers to an instance of a device class, which may be referred to collectively as devices "12" and any one of which may be referred to generically as a device "12".

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 100 contains an example of an environment for the execution of at least some of the computer code involved in performing the inventive methods, such as block 160, which includes debug component 165 configured to perform debugging over an internal interconnect fabric, such as communication fabric 111 described in greater detail herein. In addition to block 160, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 160, as identified above), peripheral device set 114 (including user interface (UI) device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

COMPUTER 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1. On the other hand, computer 101 is not required to be in a cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 160 in persistent storage 113.

COMMUNICATION FABRIC 111 is the signal conduction path that allows the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 112 is any type of volatile memory now known or to be developed in the future. Examples include dynamic type random access memory (RAM) or static type RAM. Typically, volatile memory 112 is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface-type operating systems that employ a kernel. The code included in block 160 typically includes at least some of the computer code involved in performing the inventive methods.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN 102 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

REMOTE SERVER 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

PUBLIC CLOUD 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

Figure 2:
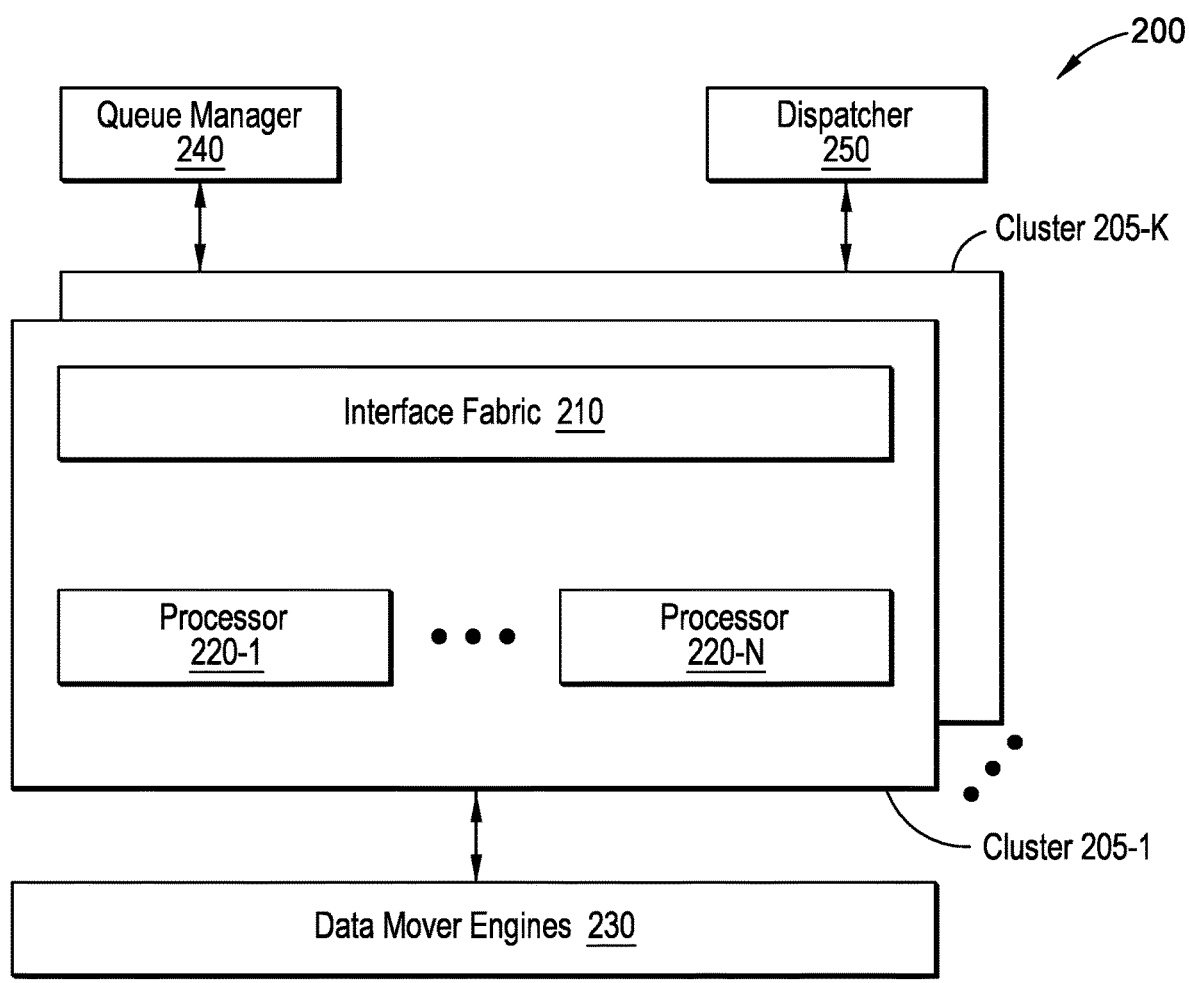
FIG. 2 illustrates an example system architecture, according to one embodiment.

FIG. 2 illustrates an example system architecture 200, according to one embodiment. In certain embodiments, the system architecture 200 is implemented within the computing environment 100 depicted in FIG. 1. The system architecture 200 includes, without limitation, multiple clusters 205 1-K, a queue manager 240, a dispatcher 250, and one or more data mover engines 230. Each cluster 205 includes an interface fabric 210 and multiple processors 220 1-N. In certain embodiments, the processors 220 within a respective cluster 205 are reduced instruction set computing (RISC)-based processors that operate using a RISC-based instruction set architecture (ISA), such as RISC-V ISA. The interface fabric 210 is generally representative of one or more interconnects (or busses) that allow the processors 220 to communicate with each other within the cluster, with other processors in another cluster, and other components within the system architecture 200. In one embodiment, the interface fabric 210 is configured and operates according to a chip-scale interconnect standard, such as the TileLink Specification, as an illustrative, non-limiting example.

The data mover engine(s) 230 are generally configured to perform data transfers between the clusters and storage. The queue manager 240 is generally configured to perform scheduling of processes on the set of processors 220 within one or more of the clusters 205. For example, the queue manager 240 may assign processes to different queues and may assign processors 220 to draw from particular queues based on the code the processor is running. The dispatcher 250 is generally configured to dispatch processes (e.g., work) to one or more of the clusters 205 based on the scheduling. Note, while the queue manager 240 and the dispatcher 250 are depicted as separate components, in certain embodiments, the queue manager 240 and the dispatcher 250 may be integrated in a single hardware component.

In certain embodiments, the system architecture 200 may include, for each processor within each cluster, a local bypass network that allows any component within the system architecture 200 to access a local component, such as a processor and a collection of registers associated with the processor with low latency. As described in greater detail below, in certain embodiments, the local bypass network may be extended to tunnel debug traffic (within the interconnect fabric traffic) to a debug port in the processor, as described in greater detail herein.

Figure 3:
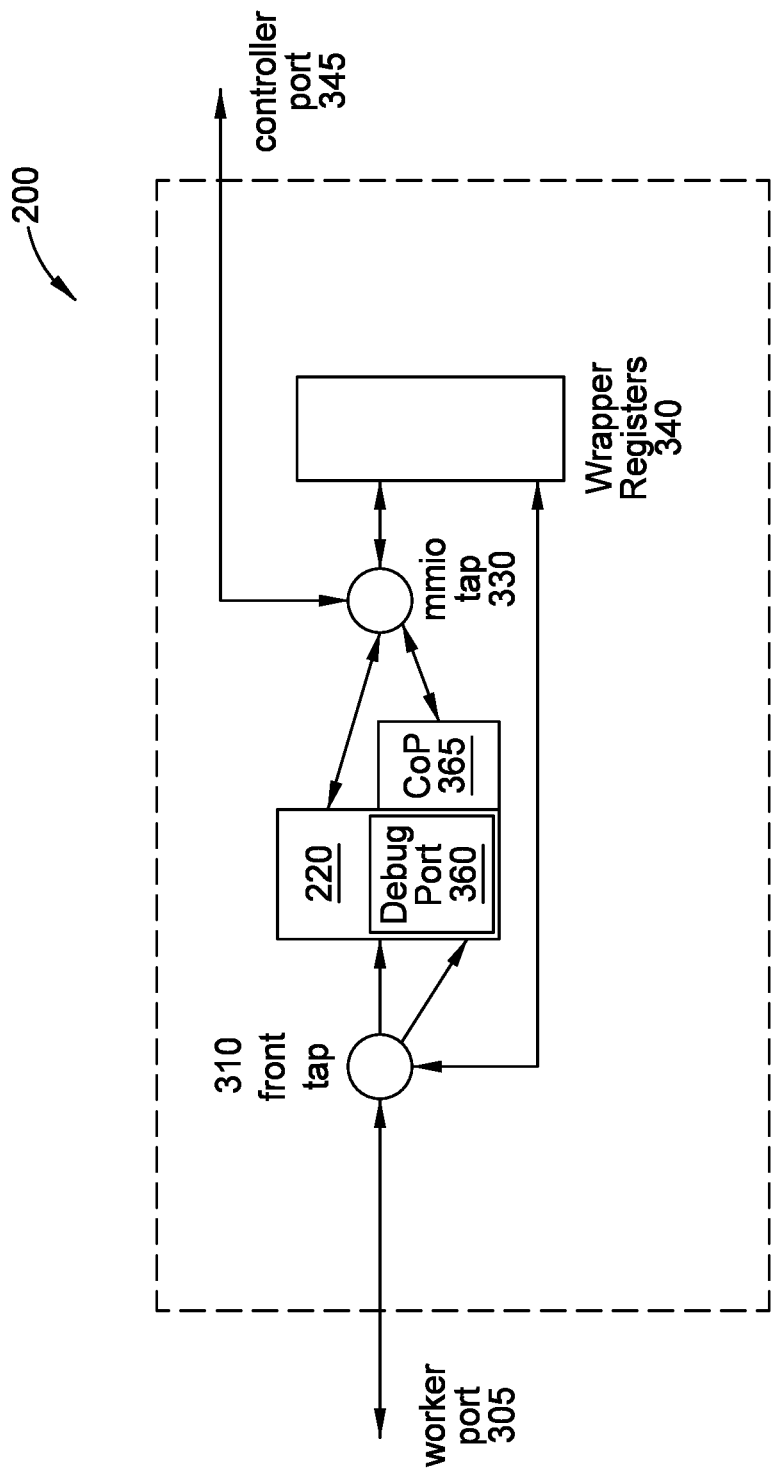
FIG. 3 further illustrates certain components of the system architecture, described relative to FIG. 2, according to one embodiment.

FIG. 3 further illustrates certain components of the system architecture 200, described relative to FIG. 2, according to one embodiment. For the sake of clarity, FIG. 3 depicts certain components associated with one of the processors 220 within one of the clusters 205 of the system architecture 200. Note, however, that similar components may be included for each processor 220 within each cluster 205 of the system architecture 200.

As shown in FIG. 3, a collection of wrapper registers 340 is placed in close proximity to the (local) processor 220 and a co-processor 365 (associated with the processor 220) in a cluster 205. The co-processor 365 is generally representative of an accelerator that can perform a variety of assist functions for the processor 220. For example, the co-processor 365 may include code that can be used to implement any desired function or process. The collection of wrapper registers 340 may be an extension to control and status registers (CSRs) provided by a RISC-based ISA. The wrapper registers 340 may include, for example, general purpose registers, I/O specific control registers, or a combination thereof.

As further shown in FIG. 3, the processor 220 is surrounded (e.g., located between) a local bypass network, which includes a tap diversion block 310 and a tap diversion block 330. The local bypass network is generally configured to route traffic to the appropriate destination based on one or more address bits in the interconnect fabric address.

For example, when the processor 220 or co-processor 365 wants to access one of the wrapper registers 340, the processor 220 or co-processor 365 may issue an instruction (e.g., load (ld) instruction, store (st) instruction, etc.) that includes an indication that the target is a register within the wrapper registers 340 associated with that processor 220 or co-processor 365. Such an indication may include one or more predefined address bits in the interconnect fabric address having a predefined value associated with the wrapper registers 340. The tap diversion block 330 may intercept the instruction, determine that the target is a register within the wrapper registers 340 and may divert the instruction directly to the wrapper registers 340 as opposed to sending the instruction out to the interface fabric via the controller port 345. In this manner, traffic from the processor 220 or co-processor 365 can be quickly diverted to the wrapper registers 340 with low latency.

In certain embodiments, the local bypass network may also enable traffic from remote processors to be quickly diverted to the wrapper registers 340 associated with a local processor 220. For example, when a remote processor 220-1 wants to access the wrapper registers 340-2 associated with a local processor 220-2, the remote processor 220-1 may include an indication within the traffic that the target is a register within the wrapper registers 340-2 associated with the local processor 220-2. Such an indication may include one or more predefined address bits in the interconnect fabric address having a predefined value associated with the wrapper registers 340. The aforementioned traffic may be routed through the worker port 305 associated with the local processor 220-2 and intercepted by the tap diversion block 310. The tap diversion block 310 may determine that the target is a register within the wrapper registers 340 and may divert the traffic directly to the wrapper registers 340 as opposed to sending the traffic to the local processor 220-2 for processing. In this manner, traffic from a remote processor can be quickly diverted to the wrapper registers 340 associated with a local processor with low latency.

As noted, in certain embodiments described herein, the local bypass network may be extended to enable processor debugging over the internal interconnect fabric. As shown in FIG. 3, the tap diversion block 310 may be configured to route and convert interconnect fabric traffic into debug traffic, so that the debug traffic is driven as interconnect fabric traffic to a debug port 360 of the processor 220. In one example, the tap diversion block 310 may include a debug component 165, which is configured to convert the interconnect fabric protocol into the native debug protocol for the processor 220. The debug targets and debug control registers may be memory mapped extensions for firmware.

Configuring the local bypass network in this manner may enable any processor to place any other processor into debug mode and send debug traffic to that other processor. Advantageously, this allows the "debugger console" to be virtualized to any processor in the system or to an external resource that can be bridged in to the system. The debug traffic may be used to perform different types of debugging, including, for example, stopping a processor, setting a breakpoint, and performing single step, as illustrative, non-limiting examples.

Figure 4:
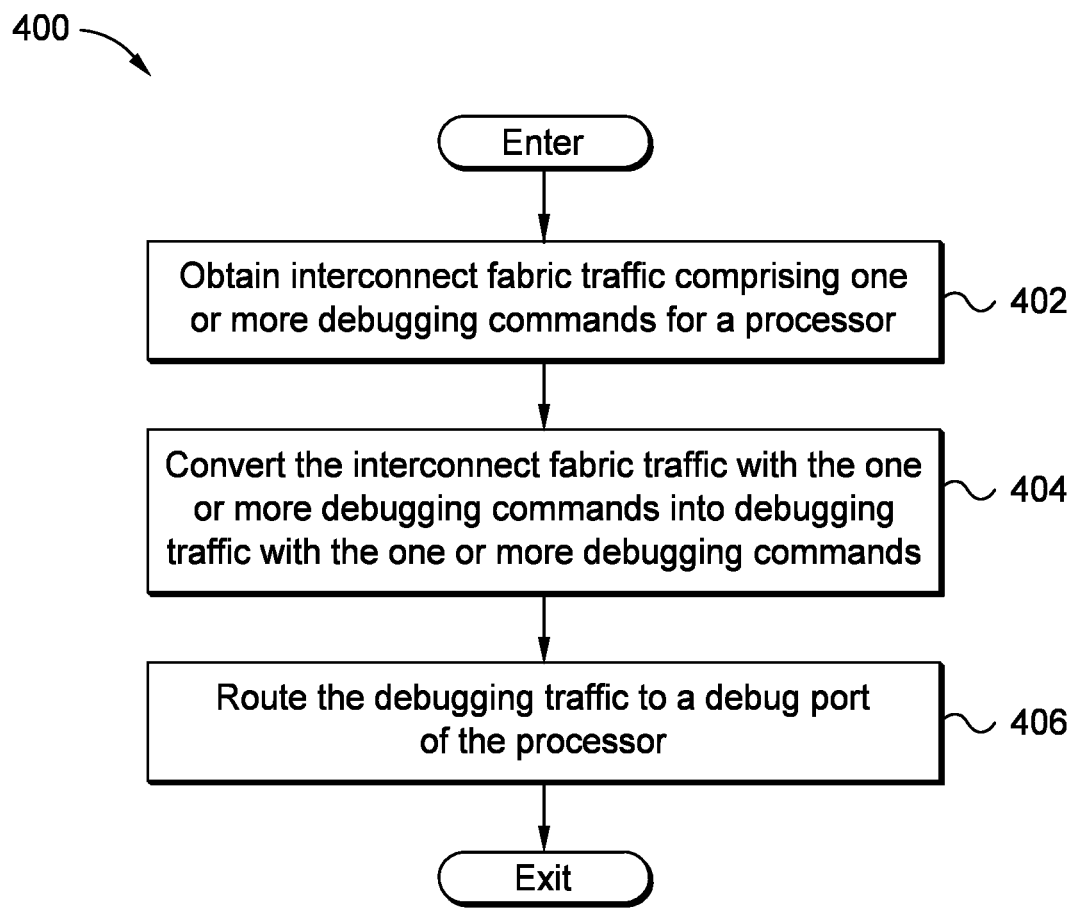
FIG. 4 is a flowchart of a method for performing processor debugging over an interconnect fabric, according to one embodiment.

FIG. 4 is a flowchart of a method 400 for performing processor debugging over an interconnect fabric, according to one embodiment. The method 400 may be performed by a debug component (e.g., debug component 165). In certain embodiments, the debug component may be included as part of a tap diversion block (e.g., tap diversion block 310) of a local bypass network.

Method 400 may enter at block 402, where the debug component obtains interconnect fabric traffic comprising one or more debugging commands for a processor (e.g., processor 220). In certain embodiments, the interconnect fabric traffic may be obtained from another processor within the data processing system (e.g., system architecture 200).

At block 404, the debug component converts the interconnect fabric traffic with the one or more debugging commands into debugging traffic with the one or more debugging commands. For example, the debug component may convert the interconnect fabric protocol (e.g., TileLink) used for the interconnect fabric traffic into the native debug control (e.g., GNU Project Debugger (GDB)) used for the processor.

At block 406, the debug component routes the debugging traffic to a debug port (e.g., debug port 360) of the processor. In certain embodiments, the debugging traffic may be run at the internal system speed (e.g., 2.6 gigahertz (GHz)) to avoid speed slowdowns typically associated with serializations, deserializations, and other operations.

While the foregoing is directed to embodiments of the present invention, other and further embodiments of the invention may be devised without departing from the basic scope thereof, and the scope thereof is determined by the claims that follow.

What is claimed is:

1. A computer-implemented method comprising:
   obtaining, from a first processor within a computing system via an interconnect fabric within the computing system, interconnect fabric traffic comprising one or more debugging commands for a second processor within the computing system;
   converting the interconnect fabric traffic comprising the one or more debugging commands into debugging traffic comprising the one or more debugging commands; and
   routing the debugging traffic comprising the one or more debugging commands to a debug port of the second processor.

2. The computer-implemented method of claim 1, wherein:
   the computing system comprises a plurality of clusters, each cluster of the plurality of clusters comprising a plurality of processors; and
   the second processor is located in a same cluster of the plurality of clusters as the first processor.

3. The computer-implemented method of claim 1, wherein:
   the computing system comprises a plurality of clusters, each cluster of the plurality of clusters comprising a plurality of processors; and
   the second processor is located in a different cluster of the plurality of clusters than the first processor.

4. The computer-implemented method of claim 1, wherein the interconnect fabric traffic is converted using a local bypass network associated with the second processor.

5. The computer-implemented method of claim 4, wherein the local bypass network comprises a tap diversion block configured to obtain the interconnect fabric traffic.

6. The computer-implemented method of claim 1, wherein:
   the computing system comprises a plurality of clusters, each cluster of the plurality of clusters comprising a plurality of processors; and the second processor is one of the plurality of processors within one of the plurality of clusters.

7. The computer-implemented method of claim 1, wherein the debugging traffic is routed to the debug port without using an external debug device that is coupled to the debug port and that is external to the computing system.

8. A system comprising:
a first processor;
a second processor different from the processor; and
a local bypass network coupled to the first second processor, wherein the local bypass network is configured to perform an operation comprising:
obtaining, from the first processor via an interconnect fabric within the system, interconnect fabric traffic comprising one or more debugging commands for the second processor within the system;
converting the interconnect fabric traffic comprising the one or more debugging commands into debugging traffic comprising the one or more debugging commands; and
routing the debugging traffic comprising the one or more debugging commands to a debug port of the first second processor.

9. The system of claim 8, wherein:
the system further comprises a plurality of clusters, each cluster of the plurality of clusters comprising a plurality of processors; and
the second processor is located in a same cluster of the plurality of clusters as the first processor.

10. The system of claim 8, wherein:
the system further comprises a plurality of clusters, each cluster of the plurality of clusters comprising a plurality of processors; and
the second processor is located in a different cluster of the plurality of clusters than the first processor.

11. The system of claim 8, wherein the local bypass network comprises a tap diversion block configured to obtain the interconnect fabric traffic.

12. The system of claim 8, further comprising a plurality of clusters, each cluster of the plurality of clusters comprising a plurality of processors, wherein the second processor is one of the plurality of processors within one of the plurality of clusters.

13. The system of claim 8, wherein the debugging traffic is routed to the debug port without using an external debug that is coupled to the debug port and that is external to the system.

14. A computer-readable storage medium having computer-readable program code embodied therewith, the computer-readable program code executable by one or more computer processors to perform an operation comprising:
obtaining, from a first processor within a computing system via an interconnect fabric within the computing system, interconnect fabric traffic comprising one or more debugging commands for a second processor within the computing system;
converting the interconnect fabric traffic comprising the one or more debugging commands into debugging traffic comprising the one or more debugging commands; and
routing the debugging traffic comprising the one or more debugging commands to a debug port of the second processor.

15. The computer-readable storage medium of claim 14, wherein:
the computing system comprises a plurality of clusters, each cluster of the plurality of clusters comprising a plurality of processors; and
the second processor is located in a same cluster of the plurality of clusters as the first processor.

16. The computer-readable storage medium of claim 14, wherein:
the computing system comprises a plurality of clusters, each cluster of the plurality of clusters comprising a plurality of processors; and
the second processor is located in a different cluster of the plurality of clusters than the first processor.

17. The computer-readable storage medium of claim 14, wherein the debugging traffic is routed to the debug port without using an external debug device that is coupled to the debug port and that is external to the computing system.

18. The computer-readable storage medium of claim 14, wherein the interconnect fabric traffic is converted using a local bypass network associated with the second processor.

19. The computer-readable storage medium of claim 18, wherein the local bypass network comprises a tap diversion block configured to obtain the interconnect fabric traffic.

20. The computer-readable storage medium of claim 14, wherein:
the computing system comprises a plurality of clusters, each cluster of the plurality of clusters comprising a plurality of processors; and
the second processor is one of the plurality of processors within one of the plurality of clusters.

\* \* \* \* \*